United States Patent
Kim et al.

(10) Patent No.: US 11,680,309 B2
(45) Date of Patent: Jun. 20, 2023

(54) METHOD FOR PREPARING AN ELECTROCHROMIC DEVICE

(71) Applicant: LG CHEM, LTD., Seoul (KR)

(72) Inventors: Yong Chan Kim, Daejeon (KR); Ki Hwan Kim, Daejeon (KR); Jeong Woo Shon, Daejeon (KR); Pil Sung Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 137 days.

(21) Appl. No.: 16/645,728

(22) PCT Filed: Sep. 11, 2018

(86) PCT No.: PCT/KR2018/010599
§ 371 (c)(1),
(2) Date: Mar. 9, 2020

(87) PCT Pub. No.: WO2019/054720
PCT Pub. Date: Mar. 21, 2019

(65) Prior Publication Data
US 2020/0299822 A1    Sep. 24, 2020

(30) Foreign Application Priority Data

Sep. 18, 2017  (KR) .................. 10-2017-0119271
Sep. 6, 2018  (KR) .................. 10-2018-0106524

(51) Int. Cl.
| | |
|---|---|
| C23C 14/08 | (2006.01) |
| C23C 14/24 | (2006.01) |
| C23C 14/34 | (2006.01) |
| G02F 1/153 | (2006.01) |

(52) U.S. Cl.
CPC ............ *C23C 14/083* (2013.01); *C23C 14/24* (2013.01); *C23C 14/34* (2013.01); *G02F 1/153* (2013.01)

(58) Field of Classification Search
CPC ....... C23C 14/083; C23C 14/24; C23C 14/34; G02F 1/153
See application file for complete search history.

(56) References Cited

U.S. PATENT DOCUMENTS

| | | | | |
|---|---|---|---|---|
| 5,716,736 | A | * | 2/1998 | Zhang .................... C03C 3/062 427/430.1 |
| 8,697,287 | B2 | * | 4/2014 | Salot .................. H01M 4/0426 429/231.95 |
| 2009/0323157 | A1 | | 12/2009 | Valentin et al. |
| 2014/0307302 | A1 | | 10/2014 | Andersson Ersman et al. |
| 2017/0192332 | A1 | | 7/2017 | Roudebush et al. |

FOREIGN PATENT DOCUMENTS

| | | | |
|---|---|---|---|
| JP | 2015-96879 A | 5/2015 | |
| KR | 10-2009-0034948 A | 4/2009 | |
| KR | 10-2012-0131396 A | 12/2012 | |
| KR | 10-2014-0068026 A | 6/2014 | |
| KR | 10-1442883 B1 | 9/2014 | |
| KR | 10-2015-0122319 A | 11/2015 | |
| KR | 10-2016-0127866 A | 11/2016 | |
| KR | 10-2017-0025612 A | 3/2017 | |
| KR | 20170025612 A * | 3/2017 | |
| WO | WO-9637809 A1 * | 11/1996 | ........... G02F 1/1525 |

OTHER PUBLICATIONS

Beydaghyan et al. Thin Solid Films 516 (2008) 1646-1650. (Year: 2008).*
Badilescu et al. .App. Spec. vol. 7 No. 6, 1993, 749-752. (Year: 1993).*
Yonghong et al. (Solar Energy Materials and Solar Cells 46 (1997) pp. 349-355).*
Ozer et al. (Conference proceedings) Sol-Gel Deposited Electrochromic Films for Electrochromic Smart Window Glass, Aug. 1996.*
International Search Report (PCT/ISA/210) issued in PCT/KR2018/010599, dated Nov. 21, 2018.
Extended European Search Report for European Application No. 18856359.7, dated Sep. 21, 2020.

* cited by examiner

*Primary Examiner* — Kelly M Gambetta
(74) *Attorney, Agent, or Firm* — Birch, Stewart, Kolasch & Birch, LLP

(57) ABSTRACT

A method for preparing an electrochromic device. In the method the device is prepared by inserting monovalent cations into a reducing electrochromic layer in advance, for instance, through a dry process. In particular, the method involves inserting monovalent cations into an electrochromic layer which includes a reducing electrochromic material. Then, subsequently and sequentially, placing an electrolyte layer and an ion storage layer on the electrochromic layer. In this way, it is possible to improve driving durability of the electrochromic device.

9 Claims, No Drawings

METHOD FOR PREPARING AN ELECTROCHROMIC DEVICE

CROSS-REFERENCE TO RELATED APPLICATIONS

The present application claims the benefit of priority based on Korean Patent Application No. 10-2017-0119271 filed on Sep. 18, 2017 and Korean Patent Application No. 10-2018-0106524 filed on Sep. 6, 2018, the disclosures of which are incorporated herein by reference in their entirety.

Technical Field

The present application relates to a method for preparing an electrochromic device.

BACKGROUND ART

Electrochromism refers to a phenomenon in which an optical property of an electrochromic material is changed by an electrochemical oxidation or reduction reaction, where the device using the phenomenon is referred to as an electrochromic device. The electrochromic device generally comprises an electrochromic layer, an electrolyte layer, and an ion storage layer between two opposing electrodes, where the electrochromic layer and the ion storage layer contain discoloring materials whose reactions for color development are opposite to each other, respectively. For example, the electrochromic layer may contain $WO_3$ which is transparent in itself but is colored blue upon reductive reaction, and the ion storage layer may contain Prussian blue (PB) which has a blue color in an oxidized state ($Fe^{III}[Fe^{II}(CN)_6]^-$) and changes transparently upon reductive reaction.

In this way, when the discoloring materials whose reactions causing color development are opposite to each other are used for different layers, for driving the electrochromic device, it is necessary to match the states of the respective layers before driving the device actually. Specifically, it is necessary to take measures such that both of the electrochromic layer and the ion storage layer are in a colorless or transparent state (decolored state) or both of them have a predetermined color (colored state). Conventionally, after producing an electrochromic device laminating all structure layers such as an electrode layer, an electrochromic layer, an electrolyte layer and an ion storage layer, a voltage higher than the driving potential was applied to the layer having an oxidizing electrochromic material such as PB for a predetermined time to forcibly insert electrolyte ions before the actual driving and the decolorization (reduction) treatment was performed on the PB. Such an operation is called a so-called initialization operation. By the way, a discoloring material such as PB, which is a target for decolorization (reduction) treatment, does not have (electrolytic) ions participating in the discoloration reaction per se, as well as when a gel polymer electrolyte is used in the device, there is a problem that the amount of electrolytic ions is smaller as compared to the case of using a liquid electrolyte, so that overvoltage has been required to completely decolorize the PB. However, the overvoltage causes deterioration of the electrode layer and the electrochromic layer, and the resulting driving durability deterioration of the device.

DISCLOSURE

Technical Problem

It is one object of the present application to provide an electrochromic device with improved driving durability and a method for preparing the same.

The above object and other objects of the present application can be resolved by the present application, which is described in detail below.

Technical Solution

In one example related to the present application, the present application relates to a method for preparing an electrochromic device. Specifically, the present application relates to a method for preparing an electrochromic device in which an electrolyte layer and an ion storage layer are placed on an electrochromic layer containing a reducing electrochromic material sequentially.

In the present application, except for the electrochromic layer and ion storage layer structures that transmittance is greatly lowered upon coloring, each layer structure used in the electrochromic device of the present application may have transmittance of 80% or more, or 85% or more, for a visible light wavelength in the range of 380 to 780 nm.

The preparation method of the present application comprises a step of inserting monovalent cations into the electrochromic layer before placing the electrolyte layer on the electrochromic layer. While the reducing electrochromic material in the electrochromic layer is reduced through the insertion of the monovalent cations, the electrochromic layer can be colored. Accordingly, the electrochromic layer having the monovalent cations inserted therein can have the same colored state as the ion storage layer containing the oxidizing electrochromic material, and consequently, the electrochromic device prepared according to the preparation method of the present application may not require the initialization operation.

In the present application, the insertion of monovalent cations into the electrochromic layer can be accomplished by a dry process. For example, the insertion of monovalent cations into the electrochromic layer can be performed by deposition. As described below, when monovalent cations are inserted by the dry process, there is an advantage that attachment force of the electrochromic layer to the adjacent layer is excellent and a separate cleaning process is unnecessary.

In one example, the insertion of monovalent cations into the electrochromic layer can be accomplished by thermal evaporation deposition or thermal gas-phase deposition. According to the above method, high heat in a vacuum state is applied to a metal source to vaporize the metal into an ionic state, which can be inserted into the electrochromic layer.

In one example, the monovalent cations are selected from the group consisting of $Li^+$, $Na^+$, $K^+$, $Rb^+$ and $Cs^+$. That is, in the thermal evaporation deposition, a metal such as Li, Na, K, Rb or Cs may be used as a source for the monovalent cations.

In the present application, the thermal evaporation deposition, that is, the process of inserting monovalent cations, can be performed so that a separate layer (metal layer) composed of a source of monovalent cations is not formed. For example, in the case where lithium ion ($Li^+$) are intended to be inserted into the electrochromic layer, the thermal evaporation deposition process of the present application may be performed such that no separate lithium layer is formed on the electrochromic layer. When a metal layer such as a lithium layer is formed, cell performance may be deteriorated. Furthermore, the formation of the metal layer can increase reflectivity inside the electrochromic device, thereby being a hindrance to the function of the electrochromic device which provides low transparency upon coloring and high transparency upon decoloring.

The thermal evaporation deposition conditions are not particularly limited as long as the thermal evaporation deposition is performed to such an extent that a separate layer composed of a source of monovalent cations cannot be formed. For example, the thermal evaporation deposition may be performed under a pressure condition of 10 mTorr or less, 5 mTorr or less, 3 mTorr or less, 1 mTorr or less, 0.1 mTorr or less, or 0.01 mTorr or less. The lower limit thereof is not particularly limited, but may be, for example, 0.0001 mTorr or more.

In one example, the thermal evaporation deposition may be performed under a temperature condition where the melting point of the metal ions to be inserted is considered. For example, the thermal evaporation deposition can be performed at a temperature above the melting point of the source metal of monovalent cations. Specifically, when the monovalent cations to be inserted is $Li^+$, the thermal evaporation deposition may be performed under a temperature condition of 180° C. or higher, which is the melting point of lithium, considering that the melting point of lithium is about 180° C. Specifically, the thermal evaporation deposition may be performed under a temperature condition in a range of about 500 to 700° C.

The time for which the thermal evaporation deposition is performed is not limited as long as it satisfies the above conditions. For example, the thermal evaporation deposition may be performed for a few seconds to several minutes under the above pressure and temperature conditions.

In one example, when the thermal evaporation deposition is performed to such an extent that a separate layer composed of a source of monovalent cations cannot be formed, the content of monovalent cations inserted into the electrochromic layer may be in a range of $1.0 \times 10^{-8}$ mol to $1.0 \times 10^{-8}$ mol, and more specifically a range of $5.0 \times 10^{-8}$ mol to $5.0 \times 10^{-7}$ mol, per $cm^2$ of the electrochromic layer.

The content of the monovalent cations inserted into the electrochromic layer, that is, the mole number can be obtained from the relationship between the charge quantity in the electrochromic layer in which monovalent cations exist and the mole number of electrons. For example, when monovalent cations are inserted into the electrochromic layer using the thermal evaporation deposition and the charge quantity of the electrochromic layer is A ($C/cm^2$), the value (A/F) of the charge quantity A divided by the Faraday constant F may be a mole number of electrons present per $cm^2$ of the electrochromic layer. On the other hand, since the electrons ($e^-$) and the monovalent cations can react at a ratio of 1:1, the maximum amount of monovalent cations present in the electrochromic layer, that is, the maximum mole number may be equal to the mole number of electrons obtained from the above. Regarding the content of monovalent cations, the method of measuring the charge quantity is not particularly limited. For example, the charge quantity can be measured by a known method such as potential step chronoamperometry (PSCA) using a potentiostat device.

In the present application, the form in which the inserted monovalent cations exist in the electrochromic layer may include all of the following cases. Specifically, in the present application, the monovalent cations inserted into the electrochromic layer may be contained in the electrochromic layer in the form of ions, and/or may also be contained in each layer in the form chemically bonded with the discoloring material constituting the electrochromic layer.

In the present application, the electrochromic layer comprises a reducing electrochromic material. In the present application, the reducing electrochromic material may be a material to be colored when the reduction reaction is performed. When the monovalent cations are inserted into the electrochromic layer containing the reducing electrochromic material as above, the electrochromic layer may have a discolored state, that is, a colored state.

The kind of the usable reducing electrochromic material in the electrochromic layer is not particularly limited. In one example, the electrochromic layer may comprise a reducing metal oxide capable of being formed by a deposition method. For example, the electrochromic layer may be a deposition layer composed of one or more oxide of one or more metal selected from the group consisting of Ti, Nb, Mo, Ta and W.

In the present application, the electrochromic layer may be formed by a dry coating method, for example, deposition. The inventors of the present application have confirmed that the durability of the electrochromic device can be changed depending on the method of forming the electrochromic layer and the method of inserting the monovalent cations into the electrochromic layer. For example, when the electrochromic layer is not formed by the dry coating method such as deposition but is formed by a wet coating method such as a method in which a coating composition is coated and then heat-treated, as the method of introducing (or inserting) monovalent cations that the electrochromic layer does not have into the electrochromic layer, for example, a method of additionally introducing a precursor capable of providing monovalent cations to a coating composition containing discoloring particles such as $WO_3$ and a solvent can be considered. However, since the injection of the monovalent cations by such a wet coating method proceeds in an organic electrolytic solution, if a cleaning process is not performed after the injection process, the decrease of the attachment force to the lamination structure such as the electrolyte layer occurs, and consequently, it causes a problem that the driving durability of the device is lowered. In particular, when the wet coating is applied, an electrochromic layer is generally formed by applying a composition containing an electrochromic material directly on an electrode, but there is a problem that for the electrode laminate (electrode/electrochromic layer) having the electrochromic layer as above, the cleaning is difficult due to realistic reasons such as loss of the inserted electrolyte ions or damage to the laminate. Then, since such a wet coating method is also unsuitable for a continuous manufacturing process of an electrochromic device using a roll-to-roll method, mass productivity is also poor. In the present application, for the electrochromic layer formed by the dry method, monovalent cations are injected thereto by the dry method, as described above, taking this point into consideration.

In one example, the electrochromic layer may be formed by sputtering deposition. The process conditions of the sputtering deposition are not particularly limited. For example, the sputtering deposition may be performed under a pressure condition in a range of 1 mTorr to 100 mTorr, and more specifically, under a pressure condition of 3 mTorr or more, 5 mTorr, or 10 mTorr or more, and 80 mTorr or less, 60 mTorr or less, 40 mTorr or less, or 30 mTorr or less. In addition, the sputtering deposition may be performed under a power condition in a range of 50 W to 500 W, and more specifically, under a power condition of 80 W or more, 100 W or more, 120 W or more, or 130 W or more, and 450 W or less, 400 W or less, 350 W or less, or 300 W or less. At this time, flow rates of argon and oxygen gases to be used are not particularly limited. Furthermore, the sputtering deposition under the above conditions can be performed within a range of several minutes to several hours.

In one example, the electrochromic layer may be formed on a conductive base material or a release base material. In each case, the insertion of monovalent cations may be performed on the opposite side of one side of the electrochromic layer in contact with the conductive base material, or may be performed on the opposite side of one side of the electrochromic layer in contact with the release base material. In the case where the electrochromic layer is formed on the release base material, a step of laminating the electrochromic layer, which is a deposition layer, with a separately formed conductive base material is required, and thus it is more preferable in terms of processability to form the electrochromic layer on the conductive base material directly.

In one example, the electrochromic layer may be formed on a conductive base material by a roll-to-roll method. For example, the method may be a method comprising a step of unwinding a conductive film from a roll on which the conductive film is wound and depositing an electrochromic layer on the unwound conductive film. The forming of the electrochromic layer on the conductive film may be by a deposition method. When using the roll-to-roll method, it is advantageous for securing productivity and processability.

In one example, the insertion of the monovalent cations can be performed on a laminate moving a predetermined path according to a roll-to-roll method. For example, when the laminate is a laminate comprising a conductive base material and an electrochromic layer sequentially, the insertion of monovalent cations into one side of the electrochromic layer in the laminate can be achieved.

In the present application, the thickness of the electrochromic layer is not particularly limited. For example, the thickness of the electrochromic layer may be 1 μm or less. Specifically, it may be 50 nm or more, 100 nm or more, 150 nm or more, or 200 nm or more, and may be 900 nm or less, 700 nm or less, 500 nm or less, or 400 nm or less.

In one example, the electrochromic layer may be a layer formed on a conductive base material. In the present application, the conductive base material may mean a layer capable of acting as a so-called electrode. In the present application, the conductive base material may have a thickness in a range of, for example, 50 nm to 400 nm.

The kind of the material used in the conductive base material is not particularly limited. For example, the conductive base material may comprise a transparent conductive compound, a metal mesh, or an OMO (oxide/metalloxide).

In one example, the transparent conductive oxide may be exemplified by ITO (indium tin oxide), $Ian_2O_3$ (indium oxide), IGO (indium gallium oxide), FTO (fluorine doped tin oxide), AZO (aluminum doped zinc oxide), GZO (gallium doped zinc oxide), ATO (antimony doped tin oxide), IZO (indium doped zinc oxide), NTO niobium doped titanium oxide), ZnO (zinc oxide) or CTO (cesium tungsten oxide), and the like. However, the material of the transparent conductive oxide is not limited to the above-listed materials.

In one example, the metal mesh may have a lattice shape comprising Ag, Cu, Al, Mg, Au, Pt, W, Mo, Ti, Ni or an alloy thereof. However, the material usable for the metal mesh is not limited to the above-listed metal materials.

In one example, the OMO may comprise an upper layer, a lower layer, and a metal layer provided between the two layers. In the present application, the upper layer may mean a layer located relatively farther from the electrolyte layer among the layers constituting the OMO. Since the OMO has lower sheet resistance over the transparent conductive oxide typified by ITO, the discoloring rate of the electrochromic device can be shortened.

The upper and lower layers of the OMO electrode may comprise a metal oxide of Sb, Ba, Ga, Ge, Hf, In, La, Se, Si, Ta, Se, Ti, V, Y, Zn, Zr or an alloy thereof. The types of the respective metal oxides included in the upper layer and the lower layer may be the same or different. The upper layer may have a thickness in a range of 10 nm to 120 nm or in a range of 20 nm to 100 nm. In addition, the upper layer may have a visible light refractive index in a range of 1.0 to 3.0 or in a range of 1.2 to 2.8. Having the refractive index and thickness in the above ranges, appropriate levels of optical characteristics can be imparted to the device. In addition, the lower layer may have a thickness in a range of 10 nm to 100 nm or in a range of 20 nm to 80 nm. In addition, the lower layer may have a visible light refractive index in a range of 1.3 to 2.7 or in a range of 1.5 to 2.5. Having the refractive index and thickness in the above ranges, appropriate levels of optical characteristics can be imparted to the device.

The metal layer included in the OMO may comprise a low resistance metal material. Without being particularly limited, for example, one or more of Ag, Cu, Zn, Au, Pd and an alloy thereof may be included in the metal layer. In one example, the metal layer may have a thickness in a range of 3 nm to 30 nm or in a range of 5 nm to 20 nm. In addition, the metal layer may have a visible light refractive index of 1 or less, or 0.5 or less. Having the refractive index and thickness in the above ranges, appropriate levels of optical characteristics can be imparted to the conductive device.

The electrolyte layer is a structure for providing electrolyte ions involved in the electrochromic reaction. The electrolyte ions are ions that may be inserted into the electrochromic layer and participate in the discoloration reaction, which may be of the same kind as the monovalent cations inserted into the electrochromic layer.

In one example, the electrolyte layer may be a gel polymer electrolyte (GPE). The gel polymer electrolyte can solve the problem of durability deterioration due to electrolyte leakage caused upon using the liquid electrolyte. It is generally known that ion transmissibility of a gel polymer electrolyte to an electrode is lower than that of a liquid electrolyte. However, in the present application, monovalent cations can be sufficiently transferred to the electrochromic layer by the thermal evaporation deposition as above, so that it is possible to provide the electrochromic device with improved ionic transmissibility more than that which has been considered in the prior art. This advantage can be confirmed by comparing the durability of the electrochromic device driven for a long time, as in the following experimental examples.

In one example, the gel polymer electrolyte layer can be formed from a crosslinkable monomer-containing composition capable of forming a polymer matrix upon crosslinking. Specifically, the gel polymer electrolyte can be formed from a composition comprising a crosslinkable monomer, a metal salt that provides monovalent cations that are the same as the monovalent cations inserted into the electrochromic layer and an organic solvent. This composition may be applied onto a release base material, followed by heat- or photo-curing. The curing conditions are not particularly limited. The thickness of the electrolyte layer formed after curing may be, for example, about 50 nm or more, about 100 nm or more, about 500 nm or more, about 1 μm or more, and the upper limit may be about 200 μm or less, about 100 μm or less, about 50 μm or less, or about 10 μm or less.

If the matrix formed after crosslinking can be transparent, the kind of the crosslinkable monomer is not particularly limited. For example, when the composition is photo-cured to form an electrolyte layer, a polyfunctional (meth)acrylate or the like may be used as the crosslinkable monomer.

The metal salt may be an alkali metal salt compound capable of providing monovalent cations, for example, $Li^+$, $Na^+$, $K^+$, $Rb^-$ or $Cs^+$. The kind of the metal salt is not particularly limited. For example, as the alkali metal salt compound, a lithium salt compound such as $LiPF_6$, $LiAsF_6$, $LiCF_3SO_3$, $LiN(CF_3SO_2)_2$, $LiBF_4$, $LiSbF_6$, $LiN(C_2F_5SO_2)_2$, $LiAlO_4$, $LiAlCl_4$, $LiCo_{0.2}Ni_{0.56}Mn_{0.27}O_2$, $LiCoO_2$, $LiSO_3CF_3$ or $LiClO_4$ or a sodium salt compound such as $NaClO_4$ can be used.

In one example, as the organic solvent, a carbonate compound may be used. Since the carbonate compound has a high dielectric constant, the conductivity of the electrolyte ions can be increased. As the carbonate compound, for example, PC (propylene carbonate), EC (ethylene carbonate), DMC (dimethyl carbonate), DEC (diethyl carbonate) or EMC (ethylmethyl carbonate) may be used.

In one example, the composition used to form the electrolyte layer may further comprise a photoinitiator or thermal initiator. As these initiators, known types of initiators may be used without limitation.

The ion storage layer may mean a layer formed to match charge balance with the electrochromic layer upon a reversible oxidation-reduction reaction for discoloration of the electrochromic material. Accordingly, the ion storage layer comprises an oxidizing electrochromic material, unlike the electrochromic layer. In the present application, the oxidizing electrochromic material may be a material to be colored when the oxidation reaction is performed. For example, when electrolyte ions of the same kind as the monovalent cations as described above are inserted into an ion storage layer containing an oxidizing electrochromic material, the ion storage layer may be decolored to have a nearly transparent state.

The kind of the oxidizing electrochromic material usable for the ion storage layer is not particularly limited. For example, the oxidizing electrochromic material included in the ion storage layer may be exemplified by one or more oxide particle of one or more metal selected from the group consisting of Cr, Mn, Fe, Co, Ni, Rh, and Ir; or Prussian blue, for example.

In one example, the ion storage layer is a porous layer formed from a coating composition including particles having electrochromism. In one example, the ion storage layer may be formed by a wet coating method. Specifically, the ion storage layer may be formed by applying a coating composition comprising (a) one or more oxide particles of metals selected from the group consisting of Cr, Mn, Fe, Co, Ni, Rh, and Ir; or (b) Prussian blue particles, on a base material, followed by drying or heat treatment. At this time, the base material on which the coating composition is applied may be a release base material or a conductive base material.

In one example, the particle diameter of the oxidizing discoloration particles is not particularly limited, but may be, for example, 5 nm or more, 10 nm or more, or 15 nm or more, and may be 100 nm or less, 50 nm or less, or 30 nm or less.

In one example, the coating composition for forming an ion storage layer may further comprise an organic solvent and/or a silane-based compound. The kind of the organic solvent or the silane-based compound is not particularly limited, and any known material can be used without limitation. For example, water or alcohol may be used as the organic solvent. Then, for example, as the silane-based compound, a (meth)acrylic silane coupling agent, an epoxy silane coupling agent, an amino silane coupling agent or an alkoxy silane coupling agent, and the like may be used, without being particularly limited to the above-listed materials.

The heat treatment conditions for the composition for forming an ion storage layer are not particularly limited. For example, the heat treatment may be performed while heat at about 200° C. or less is applied for several seconds to several minutes or several seconds to several tens of minutes. At the above temperature, the alcohol solvent can be removed, and simultaneously, the solid ion storage layer can be formed as a result of condensation and hydrolysis of the silane-based compound. The lower limit of the heat treatment temperature is not particularly limited, but may be, for example, 70° C. or higher, 75° C. or higher, 80° C. or higher, 85° C. or higher, 90° C. or higher, 95° C. or higher, or 100° C. or higher.

In one example, when the ion storage layer is formed by a wet coating method, the ion storage layer may be a porous layer. In the case of the porous layer, it can help to improve the long-term driving durability of the electrochromic device in that the movement of ions can be smoothly performed.

The thickness of the ion storage layer is not particularly limited. For example, the ion storage layer may have a thickness of 1 un or less. Specifically, it may be 50 nm or more, 100 nm or more, 150 nm or more, or 200 nm or more, and may be 900 nm or less, 700 nm or less, 500 nm or less, or 400 nm or less.

In one example, the ion storage layer may be a layer formed directly on the conductive base material. That is, in the present application, the composition for forming the ion storage layer may be applied directly on the conductive base material and then heat-treated to form the layer. The conductive base material contacting the ion storage layer directly may be referred to as a second conductive base material to distinguish it from the conductive base material adjacent to the electrochromic layer, and the specific structure thereof may be the same as that described above. In such a case, the method of the present application may be a method further comprising a step of laminating layer structures so that the electrolyte layer, the ion storage layer and the second conductive base material can be sequentially positioned on one side of the electrochromic layer. More specifically, the method may be a method further comprising a step of laminating a first laminate comprising a conductive base material and an electrochromic layer with a second laminate comprising a second conductive base material and an ion storage layer via a gel polymer electrolyte layer. At this time, a specific method for laminating layer structures is not particularly limited, and a known lamination method and the like can be suitably applied.

In one example, the ion storage layer may be a layer formed on the electrolyte layer. More specifically, it may be a layer formed by applying a coating composition for forming an ion storage layer on an electrolyte layer of a laminate comprising a conductive base material, an electrochromic layer and an electrolyte layer sequentially or a laminate comprising an electrochromic layer and an electrolyte layer sequentially and then drying it. Alternatively, it may be a layer formed by applying a coating composition for forming an ion storage layer on a release base material or on a gel polymer electrolyte layer present as a single layer, and then heat-treating it.

In one example, the electrochromic device may further comprise a light-transmitting base material on the outside surface of each conductive base material. The kind of the light-transmitting base material is not particularly limited, where glass or a polymer resin may be used. For example, a polyester film such as PC (polycarbonate), PEN (poly(ethylene naphthalate)) or PET (poly(ethylene terephthalate)), an acrylic film such as PMMA (poly(methyl methacrylate)), or a polyolefin film such as PE (polyethylene) or PP (polypropylene), and the like may be used as a light-transmitting base material. As described above, when the electrochromic device further comprises a light-transmitting base material, the method may be a method further comprising a step of forming the conductive base material having the above-described structure on the light-transmitting base material, prior to forming the electrochromic layer on the conductive base material or prior to forming the ion storage layer on the second conductive base material.

Advantageous Effects

According to one example of the present application, in the present application, monovalent cations are inserted into the electrochromic layer in advance by a dry process before laminating between the respective layer structures for device formation, so that both the electrochromic layer and the ion storage layer can be laminated in a colored state. Accordingly, since no separate initialization operation is required after the lamination, the durability deterioration of the electrochromic device can be prevented. In addition, according to the present application, since the formation of the electrochromic layer and the insertion of monovalent cations can be performed in a roll-to-roll manner, the present application can improve processability and productivity of the electrochromic device.

BEST MODE

Hereinafter, the present application will be described in detail through examples. However, the scope of protection of the present application is not limited by the following examples.

Method for Measuring Driving Characteristics of Electrochromic Film
<Charge Amount>
While changing the driving cycle of the electrochromic film, the charge amount of each film in Examples and Comparative Example was measured by using potential step chronoamperometry (PSCA) using a potentiostat device and the charge amount upon one cycle driving and the charge amount after 500 cycles were compared and described in Table 1.
<Transmittance>
Transmittance upon coloring: It means transmittance in a final coloring state observed after elapse of a time (50 s) during which a potential for coloring is applied. The colored film transmittance at the time of driving 500 cycles was described in Table 1.
Transmittance upon decoloring: It means transmittance in a final decoloring state observed after elapse of a time (50 s) during which a potential for decoloring is applied. The decolored film transmittance at the time of driving 500 cycles was described in Table 1.
<Discoloration Rate>
Coloring time (unit: second): When the transmittance in a final coloring state observed after elapse of a time (50 s) during which a potential for coloring is applied is set to 100, it means a time taken to reach a level of 80. The time taken to be colored until the decolored film satisfies the above level at the time of driving 500 cycles was described in Table 1.
Decoloring time (unit: second): When the transmittance in a final decoloring state observed after elapse of a time (50 s) during which a potential for decoloring is applied is set to 100, it means a time taken to reach a level of 80. The time taken to be decolored until the colored film satisfies the above level at the time of driving 500 cycles was described in Table 1.

EXAMPLES AND COMPARATIVE EXAMPLE

Example 1

On an ITO/PET laminate with a thickness of 250 nm, a $WO_3$ layer with a thickness of 300 nm was laminated using a sputtering method (process pressure 15 mTorr, deposition power 200 W, and deposition time 30 minutes). Specifically, using the roll-to-roll equipment, the laminate film was unwound from the roll on which the film was wound and simultaneously the $WO_3$ layer was formed on one side of the ITO of the unwound film Thereafter, lithium ions ($Li^+$) were inserted into $WO_3$ of an ITO/$WO_3$ laminate under conditions of $10^{-6}$ Torr and 640° C. using a thermal evaporation deposition method, and the $WO_3$ layer was colored. At this time, the time for performing the thermal evaporation deposition is 10 seconds, and the lithium doping amount is $2.0363 \times 10^{-7}$ (mol/$cm^2$).

Then, the ITO/$WO_3$ laminate was bonded to a PB/ITO/PET laminate via a gel polymer electrolyte (GPE) with a thickness of 150 nm to prepare an electrochromic film with a PET/ITO/$WO_3$/GPE/PB/ITO/PET structure. Thus, before the actual driving, the electrochromic film had a relatively low light transmission characteristic (colored state). The PB layer was prepared by coating a coating solution containing 30 wt % of Prussian blue particles having a diameter of 20 nm, 65 wt % of ethanol and 5 wt % of TEOS (tetraethoxysilane) on the ITO with a bar coater and then drying it at 110° C. for 5 minutes. The thickness of the PB layer is 250 nm.

For the film, the transmittance, the driving charge amount and the discoloration rate were observed while applying decoloring and coloring voltages of +2V per cycle for 50 seconds, respectively. The results are shown in Table 1.

Example 2

An electrochromic film having the same structure was prepared in the same manner as in Example 1, except that the time during which the thermal evaporation deposition was performed was 20 seconds (lithium doping amount $3.1090 \times 10^{-7}$ (mol/$cm^2$)).

Example 3

An electrochromic film having the same structure was prepared in the same manner as in Example 1, except that the time during which thermal evaporation deposition was performed was 30 seconds (lithium doping amount $4.1090 \times 10^{-7}$ (mol/$cm^2$)).

Comparative Example 1

An electrochromic device having the same lamination structure as in Example 1 was prepared in the same manner as in Example 1, except that the process of inserting lithium ions by thermal deposition was omitted.

Thereafter, a voltage of −5 V was applied to the PB/ITO side of the film for 3 minutes to decolor the PB. Thus, the electrochromic film had a relatively high light transmission characteristic before actual driving. For the film, the transmittance, the driving charge amount and the discoloration rate were observed while applying decoloring and coloring voltages having the same size at the same time intervals. The results are shown in Table 1.

TABLE 1

| | Lithium doping time by thermal deposition | Driving charge amount (mC) | | Transmittance (%, 500 cycle) | | Discoloration rate (second, 500 cycle) | |
|---|---|---|---|---|---|---|---|
| | | 1 cycle | 50 cycle | Colored | Decolored | Colored | Decolored |
| Comparative Example 1 | 0 | 148 | 14 | 51 | 68 | 16 | 16 |
| Example 1 | 10 seconds | 250 | 50 | 40 | 70 | 15 | 18 |
| Example 2 | 20 seconds | 285 | 300 | 25 | 70 | 15 | 19 |
| Example 3 | 30 seconds | 302 | 301 | 24 | 70 | 19 | 17 |

From Table 1, it can be seen that as the driving time elapses, the decrease width in the driving charge amount and the colored/decolored transmittance observed in the film of Comparative Example is larger than that in Examples. This means that the long-term driving durability of the films produced according to Examples is superior to that of Comparative Example.

The invention claimed is:

1. A method for preparing an electrochromic device, comprising:
    inserting monovalent cations into an electrochromic layer comprising a reducing electrochromic material; and
    laminating the electrochromic layer and an ion storage layer via an electrolyte layer,
    wherein both the electrochromic layer and the ion storage layer are laminated in a colored state;
    the monovalent cations are inserted into the electrochromic layer by thermal evaporation deposition;
    the thermal evaporation deposition is performed under conditions of a pressure of 10 mTorr or less and a temperature in a range of 500° C. to 700° C.;
    wherein the thermal evaporation deposition is performed so that a separate metal layer composed of a source of monovalent cations is not formed; and
    a content of monovalent cations inserted into the electrochromic layer is in a range of $1.0 \times 10^{-8}$ mol to $1.0 \times 10^{-6}$ mol, wherein the mole number of the monovalent cations inserted into the electrochromic layer is equal to a mole number of electrons present per $cm^2$ of the electrochromic layer which is obtained by dividing a charge quantity ($C/cm^2$) of the electrochromic layer with the Faraday constant (C/mol).

2. The method for preparing an electrochromic device according to claim 1, wherein the monovalent cations are selected from the group consisting of $Li^+$, $Na^+$, $K^+$, $Rb^+$ and $Cs^+$.

3. The method for preparing an electrochromic device according to claim 1, wherein the electrochromic layer comprises one or more oxide of one or more metal selected from the group consisting of It, Nb, Mo, Ta and W.

4. The method for preparing an electrochromic device according to claim 3, further comprising a step of forming the electrochromic layer on a conductive base material using roll-to-roll equipment.

5. The method for preparing an electrochromic device according to claim 4, comprising steps: unwinding the conductive base material from the roll-to-roll equipment; and forming the electrochromic layer on the unwound conductive base material by a deposition method.

6. The method for preparing an electrochromic device according to claim 5, wherein the deposition method is sputtering deposition, and
    the sputtering deposition is performed under conditions of a pressure of 1 mTorr to 100 mTorr and a power of 50 W to 500 W.

7. The method for preparing an electrochromic device according to claim 1, wherein the electrolyte layer comprises a gel polymer electrolyte formed from a composition comprising a metal salt that provides monovalent cations that are the same as the monovalent cations inserted into the electrochromic layer, an organic solvent, and a crosslinkable monomer.

8. The method for preparing an electrochromic device according to claim 1, wherein the ion storage layer is a porous layer formed from a coating composition comprising particles having electrochromism.

9. The method for preparing an electrochromic device according to claim 8, wherein the ion storage layer is formed by applying a coating composition comprising (a) one or more oxide particle of one or more metal selected from the group consisting of Cr, Mn, Fe, Co, Ni, Rh, and Irk; or (b) Prussian blue particles, on a second conductive base material, followed by heat treatment.

* * * * *